(12) United States Patent
Watai et al.

(10) Patent No.: US 8,198,115 B2
(45) Date of Patent: Jun. 12, 2012

(54) SOLAR CELL, AND METHOD AND APPARATUS FOR MANUFACTURING THE SAME

(75) Inventors: Miwa Watai, Sanmu (JP); Kazuya Saito, Sanmu (JP); Takashi Komatsu, Sanmu (JP); Atsushi Ota, Sanmu (JP); Shunji Kuroiwa, Sanmu (JP); Miho Shimizu, Sanmu (JP)

(73) Assignee: ULVAC, Inc., Chigasaki-Shi (JP)

( * ) Notice: Subject to any disclaimer, the term of this patent is extended or adjusted under 35 U.S.C. 154(b) by 0 days.

(21) Appl. No.: 12/933,829

(22) PCT Filed: Apr. 21, 2009

(86) PCT No.: PCT/JP2009/057905
§ 371 (c)(1),
(2), (4) Date: Sep. 21, 2010

(87) PCT Pub. No.: WO2009/131111
PCT Pub. Date: Oct. 29, 2009

(65) Prior Publication Data
US 2011/0020976 A1   Jan. 27, 2011

(30) Foreign Application Priority Data
Apr. 25, 2008 (JP) ................ 2008-115977

(51) Int. Cl.
*H01L 21/00* (2006.01)
*H01L 31/20* (2006.01)
(52) U.S. Cl. ........ 438/48; 438/57; 257/59; 257/72; 257/E31.001; 257/E31.002

(58) Field of Classification Search ........... 438/48, 438/57, 69, 73; 257/59, 62, 72; 313/504, 313/506; 428/690, 917
See application file for complete search history.

(56) References Cited

U.S. PATENT DOCUMENTS

| | | | |
|---|---|---|---|
| 6,380,479 B2* | 4/2002 | Nakai et al. ................ | 136/246 |
| 7,700,400 B2* | 4/2010 | Onishi et al. ................ | 438/98 |
| 2003/0092226 A1* | 5/2003 | Nagashima et al. ......... | 438/184 |
| 2005/0077589 A1 | 4/2005 | Gong et al. | |
| 2007/0169804 A1* | 7/2007 | Nakata ........................ | 136/250 |
| 2008/0121278 A1* | 5/2008 | Ito et al. ..................... | 136/256 |
| 2009/0211635 A1* | 8/2009 | Niira et al. .................. | 136/258 |
| 2009/0272419 A1* | 11/2009 | Sakamoto et al. ........... | 136/244 |
| 2010/0190286 A1* | 7/2010 | Kohira et al. ............... | 438/57 |

FOREIGN PATENT DOCUMENTS
EP     1 403 934     3/2004
(Continued)

OTHER PUBLICATIONS

International Search Report from corresponding PCT Application No. PCT/JP2009/057905 dated Jun. 9, 2009.

(Continued)

*Primary Examiner* — Hsien Ming Lee
(74) *Attorney, Agent, or Firm* — Grossman, Tucker, Perreault & Pfleger, PLLC

(57) ABSTRACT

A method for manufacturing a solar cell, includes: forming, on a silicon substrate whose conductivity type is p-type or n-type, a silicon layer including a dopant whose conductivity type is different from that of the silicon substrate; and diffusing the dopant included in the silicon layer into the silicon substrate by heat-treating the silicon layer.

14 Claims, 3 Drawing Sheets

FOREIGN PATENT DOCUMENTS

| | | |
|---|---|---|
| EP | 1 870 944 A1 * | 12/2007 |
| JP | 63-283172 | 11/1988 |
| JP | 64-89568 | 4/1989 |
| JP | 1-290267 | 11/1989 |
| JP | 5-259488 | 10/1993 |
| JP | 6-29562 | 2/1994 |
| JP | 8-55818 | 2/1996 |
| JP | 8-85874 | 4/1996 |
| JP | 10-233518 | 9/1998 |
| JP | 2000-323735 | 11/2000 |
| JP | 2001-144022 | 5/2001 |
| JP | 2004-14958 | 1/2004 |
| JP | 2004-221119 | 8/2004 |
| JP | 2004-247364 | 9/2004 |
| JP | 2005-123553 | 5/2005 |
| SU | 1 686 983 | 6/1998 |

OTHER PUBLICATIONS

Office Action from corresponding Russian Application No. 2010137796 dated Oct. 11, 2011. English translation attached.

Decision on Grant from corresponding Russian Application No. 2010137796 dated Jan. 24, 2012. English translation attached.

* cited by examiner

SOLAR CELL, AND METHOD AND APPARATUS FOR MANUFACTURING THE SAME

BACKGROUND OF THE INVENTION

1. Field of the Present Invention

The present invention relates to a solar cell, and a method and an apparatus for manufacturing the same.

Furthermore, the present invention particularly relates to a method for manufacturing a solar cell, an apparatus for manufacturing a solar cell, and a solar cell, where it is possible to shorten the length of time for a heat-treating when a diffused layer is formed in a silicon substrate and possible to manufacture a solar cell having the photoelectric conversion efficiency that is equal to that of a conventional solar cell.

This application claims priority from Japanese Patent Application No. 2008-115977 filed on Apr. 25, 2008, the contents of which are incorporated herein by reference in their entirety.

2. Background Art

In recent years, regarding solar cells having a high level of power generation capability by sunlight, various improvements have progressed with demand for clean energy.

As solar cells, conventionally, a solar cell manufactured using a silicon series material is representative, a single-crystalline silicon solar cell employing single-crystalline silicon, a polysilicon solar cell employing polysilicon layer, an amorphous silicon solar cell employing an amorphous silicon layer, and the like are known.

A single-crystalline silicon solar cell has a structure in which, for example, a diffused layer in which phosphorus (P) that is an n-type dopant is diffused in silicon single-crystalline, an anti-reflective film made of silicon nitride ($Si_3N_4$) or the like, and a top electrode are formed on a top face of a p-type single-crystalline silicon substrate in this order, in addition, a BSF layer and a bottom electrode are formed on a back face of the silicon substrate in this order.

A texture structure for anti-reflection is formed on the top face of the single-crystalline silicon substrate by texture etching.

In addition, the diffused layer is obtained by heat-diffusing phosphorus (P) in the above-described top face of the silicon substrate; as a method for diffusing phosphorus (P), a gas diffusion method, a method for applying and diffusing, or the like may be used (Japanese Unexamined Patent Application, First Publication No. H06-29562 and Japanese Unexamined Patent Application, First Publication No. 2004-247364).

Since impurities remain on the surface of the diffused layer, the surface of the diffused layer is rinsed with hydrofluoric acid or the like in order to remove the impurities.

Consequently, in a solar cell manufacturing step, a substrate is once removed from an apparatus used for a diffusing step in an air atmosphere, and is rinsed out; furthermore, it is necessary to bring in the rinsed substrate into a vacuum apparatus in which an anti-reflective film is formed.

In addition, as a method for forming a top electrode, a so-called fire-through process is employed (Japanese Unexamined Patent Application, First Publication No. H5-259488, Japanese Unexamined Patent Application, First Publication No. H10-233518, and Japanese Unexamined Patent Application, First Publication No. 2000-323735). In the fire-through process, a silver paste is applied on the anti-reflective film so as to form a predetermined pattern, the silver paste is baked, a silver electrode is thereby formed, and the silver electrode breaks through the anti-reflective film in contact with the diffused layer by the baking.

However, in conventional silicon solar cells, a heat-treating for a long period of time is necessary to heat-diffuse phosphorus (P) on the top face of the silicon substrate, two times or more of heat-treating is necessary in addition to forming the top electrode; as a result, there are problems in that the manufacturing time, the number of steps, and the cost of manufacturing increase.

In addition, it is necessary to rinse the substrate after diffusing, the manufacturing time and the number of steps increase, and there is thereby a problem in that the throughput of manufacturing solar cells is degraded.

SUMMARY OF THE INVENTION

The present invention was made in order to solve the above problems, and has an object to provide a method for manufacturing a solar cell, an apparatus for manufacturing a solar cell, and a solar cell, where it is possible to shorten the length of time for heat-treating when a diffused layer is formed in a silicon substrate, additionally, it is possible to shorten the manufacturing time and eliminate the number of steps by performing the steps of diffusing the dopant and the fire-through processing of the top electrode at the same time, furthermore, it is possible to manufacture a solar cell having the same photoelectric conversion efficiency as that of a conventional solar cell.

Alternatively, the present invention has an object to provide a method for manufacturing a solar cell, an apparatus for manufacturing a solar cell, and a solar cell where a rinsing step in an air atmosphere is not necessary after the diffusing step.

The inventors conducted diligent research for a silicon series solar cell, and as a result, they discovered the following.

That is, the inventors found that, a silicon layer including dopant is formed on a silicon substrate, if the dopant included in the silicon layer is diffused in the silicon substrate by heat-treating after or simultaneously forming of the silicon layer, the dopant included in the silicon layer is diffused in the silicon substrate in the process of heat-treating and a diffused layer can be formed. Furthermore, it is possible to shorten the length of time for heat-treating when a diffused layer is formed in a silicon substrate, and the obtained solar cell has the photoelectric conversion efficiency that is equal to that of a conventional solar cell. The inventors completed the present invention.

A method for manufacturing a solar cell of a first aspect of the present invention, includes: forming, on a silicon substrate whose conductivity type is p-type or n-type, a silicon layer including a dopant whose conductivity type is different from that of the silicon substrate (silicon layer formation step); and diffusing the dopant included in the silicon layer into the silicon substrate by heat-treating the silicon layer (heat treatment step).

A method for manufacturing a solar cell of a second aspect of the present invention, includes: forming, on a silicon substrate whose conductivity type is p-type or n-type, a silicon layer including a dopant whose conductivity type is different from that of the silicon substrate; and diffusing the dopant included in the silicon layer into the silicon substrate by heating the silicon substrate during the forming of the silicon layer (silicon layer formation and heat treatment step).

It is preferable that the method for manufacturing a solar cell of the first aspect of the present invention further include: forming an anti-reflective film on the silicon layer in a state where the silicon substrate is maintained under a vacuum atmosphere (anti-reflective film formation step), after the silicon layer is formed (silicon layer formation step).

It is preferable that the method for manufacturing a solar cell of the first aspect of the present invention further include: forming an anti-reflective film on the silicon layer (anti-reflective film formation step) after the silicon layer is formed (silicon layer formation step); and forming a top electrode on the anti-reflective film (top electrode formation step), wherein when the dopant included in the silicon layer is diffused in the silicon substrate (heat treatment step), the top electrode is electrically-conducted to the silicon layer or the silicon substrate and the dopant is diffused in the silicon substrate by heating the silicon substrate in which the silicon layer, the anti-reflective film, and the top electrode were formed It is preferable that, in the method for manufacturing a solar cell of the first aspect of the present invention, when the silicon layer is formed (silicon layer formation step), a silicon layer including an n-type dopant be formed on the top face of a p-type silicon substrate; after the silicon layer is formed (silicon layer formation step), a bottom electrode including aluminum be formed on a back face of the silicon substrate (bottom electrode formation step); and when the dopant included in the silicon layer is diffused in the silicon substrate (heat treatment step), the dopant be diffused in the silicon substrate and part of the aluminum of the bottom electrode be diffused in the silicon substrate by heating the silicon substrate in which the silicon layer and the bottom electrode were formed.

It is preferable that, in the method for manufacturing a solar cell of the first and second aspects of the present invention, when the dopant included in the silicon layer is diffused in the silicon substrate (heat treatment step), maximum level of heating temperature be greater than or equal to 600° C. and less than or equal to 1200° C., and heating time be greater than or equal to 1 minute and less than or equal to 120 minutes.

It is preferable that, in the method for manufacturing a solar cell of the first and second aspects of the present invention, when the dopant included in the silicon layer is diffused in the silicon substrate by heating the silicon substrate during the forming of the silicon layer (silicon layer formation and heat treatment step), the maximum level of heating temperature be greater than or equal to 600° C. and less than or equal to 1200° C., and heating time be greater than or equal to 1 minute and less than or equal to 120 minutes.

It is preferable that the method for manufacturing a solar cell of the first and second aspects of the present invention further include: exposing the silicon substrate to plasma in a vacuum (plasma treatment step) before forming the silicon layer (silicon layer formation step), and subsequently forming the silicon layer in a state where the silicon substrate is maintained under a vacuum atmosphere (silicon layer formation step) after the silicon substrate was exposed to plasma (silicon layer formation step).

It is preferable that the method for manufacturing a solar cell of the first and second aspects of the present invention further include: exposing the silicon substrate to plasma in a vacuum (plasma treatment step) before diffusing the dopant included in the silicon layer into the silicon substrate by heating the silicon substrate during the forming of the silicon layer (silicon layer formation and heat treatment step); and subsequently diffusing the dopant included in the silicon layer into the silicon substrate by heating the silicon substrate during the forming of the silicon layer in a state where the silicon substrate is maintained under a vacuum atmosphere (silicon layer formation and heat treatment step) after the silicon substrate was exposed to plasma (plasma treatment step).

It is preferable that, in the method for manufacturing a solar cell of the first and second aspects of the present invention, the silicon layer be formed by a plasma chemical vapor deposition method, the silicon substrate be exposed to plasma (plasma treatment step) and the silicon layer be formed (silicon layer formation step) by use of the same plasma chemical vapor deposition apparatus.

It is preferable that, in the method for manufacturing a solar cell of the first and second aspects of the present invention, the silicon layer be formed by a plasma chemical vapor deposition method, the silicon substrate be exposed to plasma (plasma treatment step) and the dopant included in the silicon layer be diffused into the silicon substrate by heating the silicon substrate during the forming of the silicon layer (silicon layer formation and heat treatment step) by use of the same plasma chemical vapor deposition apparatus.

It is preferable that the method for manufacturing a solar cell of the first and second aspects of the present invention further include: forming a texture by dry-etching the top face of the silicon substrate in a vacuum (etching step) before forming the silicon layer (silicon layer formation step); and subsequently forming the silicon layer in a state where the silicon substrate is maintained under a vacuum atmosphere (silicon layer formation step) after the etching.

It is preferable that the method for manufacturing a solar cell of the first and second aspects of the present invention further include: forming a texture by dry-etching the top face of the silicon substrate in a vacuum (etching step) before diffusing the dopant included in the silicon layer into the silicon substrate by heating the silicon substrate during the forming of the silicon layer (silicon layer formation and heat treatment step); and subsequently diffusing the dopant included in the silicon layer into the silicon substrate by heating the silicon substrate during the forming of the silicon layer in a state where the silicon substrate is maintained under a vacuum atmosphere (silicon layer formation and heat treatment step) after the etching.

It is preferable that the method for manufacturing a solar cell of the first and second aspects of the present invention further include: forming a texture by dry-etching the top face of the silicon substrate in a vacuum (etching step) before forming the silicon layer (silicon layer formation step); and subsequently exposing the silicon substrate to plasma in a state where the silicon substrate is maintained under a vacuum atmosphere (plasma treatment step) after the etching.

It is preferable that the method for manufacturing a solar cell of the first and second aspects of the present invention further include: forming a texture by dry-etching the top face of the silicon substrate in a vacuum (etching step) before diffusing the dopant included in the silicon layer into the silicon substrate by heating the silicon substrate during the forming of the silicon layer (silicon layer formation and heat treatment step); and subsequently exposing the silicon substrate to plasma in a state where the silicon substrate is maintained under a vacuum atmosphere (plasma treatment step) after the etching.

In addition, an apparatus for manufacturing a solar cell of a third aspect of the present invention includes: a first-film formation device forming a silicon layer on a substrate while introducing a gas including a dopant onto the substrate; a second-film formation device forming an anti-reflective film on the silicon layer; an electrode formation device forming an electrode on the substrate or on the anti-reflective film; and a heating device heating the substrate.

It is preferable that, in the apparatus for manufacturing a solar cell of the third aspect of the present invention, the first-film formation device comprise a heating section heating the substrate.

It is preferable that, in the apparatus for manufacturing a solar cell of the third aspect of the present invention, the first-film formation device comprise a plasma processing section exposing the substrate to plasma.

It is preferable that the apparatus for manufacturing a solar cell of the third aspect of the present invention further include: a substrate transfer mechanism transferring the substrate to the first-film formation device, the second-film formation device, the electrode formation device, and the heating device in this order.

In addition, a solar cell of a fourth aspect of the present invention includes: a silicon substrate whose conductivity type is p-type or n-type; a diffused layer formed in the silicon substrate and adjacent top face of the silicon substrate, in which a dopant whose conductivity type is different from that of the silicon substrate is diffused; and a silicon layer stacked on the diffused layer in layers, including the dopant.

It is preferable that, in the solar cell of the fourth aspect of the present invention, the dopant concentration of the diffused layer be less than the dopant concentration of the silicon layer.

According to the method for manufacturing a solar cell of the first aspect of the present invention, the method includes the silicon layer formation step in which the silicon layer including the dopant whose conductivity type is different from that of the silicon substrate is formed on the silicon substrate whose conductivity type is p-type or n-type, and the heat treatment step in which the silicon layer is treated by heating and the dopant included in the silicon layer is diffused in the silicon substrate; therefore, it is also possible to make the photoelectric conversion efficiency thereof equal to that of a conventional solar cell.

In addition, as compared with a conventional method, it is possible to form the diffused layer in a short time, therefore, it is possible to shorten the manufacturing time, eliminate the number of steps, and reduce the cost of manufacturing.

According to the method for manufacturing a solar cell of the second aspect of the present invention, the method includes the silicon layer formation and heat treatment step in which the silicon layer including the dopant whose conductivity type is different from that of the silicon substrate is formed on the silicon substrate whose conductivity type is p-type or n-type, and the dopant included in the silicon layer is diffused in the silicon substrate by heating the silicon substrate during the forming of the silicon layer; therefore, it is also possible to make the photoelectric conversion efficiency thereof equal to that of a conventional solar cell.

In addition, as compared with a conventional method, it is possible to form the diffused layer in a short time, therefore, it is possible to shorten the manufacturing time, eliminate the number of steps, and reduce the cost of manufacturing.

According to the apparatus for manufacturing a solar cell of the third aspect of the present invention, since the apparatus is provided with: the first-film formation device forming the silicon layer on the substrate while introducing the gas including the dopant onto the substrate; the second-film formation device forming the anti-reflective film on the silicon layer; the electrode formation device forming the electrode on the substrate or on the anti-reflective film; and the heating device heating the substrate, it is possible to manufacture a solar cell having a photoelectric conversion efficiency that is equal to that of a conventional solar cell in a short time as compared with a conventional apparatus.

Therefore, it is possible to shorten the manufacturing time in a solar cell manufacturing step, eliminate the number of steps, and reduce the cost of manufacturing.

According to the solar cell of the fourth aspect of the present invention, the diffused layer is formed in the silicon substrate and adjacent top face of the silicon substrate, the conductivity type of the substrate is p-type or n-type, the dopant whose conductivity type is different from that of the silicon substrate is diffused in the diffused layer, and the silicon layer including the dopant is stacked on the diffused layer in layers; therefore, it is possible to provide a solar cell having a photoelectric conversion efficiency that is equal to that of a conventional solar cell, furthermore, to provide inexpensive solar cell in a short time as compared with a conventional solar cell.

DESCRIPTION OF THE PREFERRED EMBODIMENTS

Preferred embodiments will be described in order to conduct a method for manufacturing a solar cell, an apparatus for manufacturing a solar cell, and a solar cell of the present invention.

The embodiment is specifically explained for appropriate understanding the scope of the present invention, and does not limit the present invention unless otherwise specified.

First Embodiment

Figure 1:
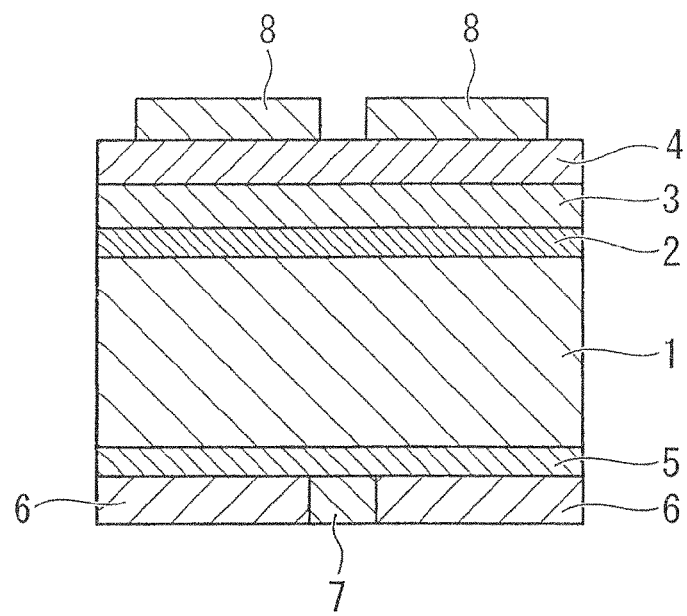
FIG. 1 is a cross-sectional view showing a solar cell of a first embodiment of the present invention.

FIG. 1 is a cross-sectional view showing a solar cell of a first embodiment of the present invention.

In FIG. 1, reference numeral 1 represents a silicon substrate, reference numeral 2 represents a diffused layer, reference numeral 3 represents a silicon layer, reference numeral 4 represents an anti-reflective film, reference numeral 5 represents a BSF layer, reference numeral 6 represents first bottom electrodes, reference numeral 7 represents a second bottom electrode, and reference numeral 8 represents a top electrode.

As the silicon substrate 1, any one of substrates, that is, a p-type single-crystalline silicon substrate in which p-type dopant such as boron (B), gallium (Ga), aluminum (Al), indium (In), or the like is diffused in single-crystalline silicon, an n-type single-crystalline silicon substrate in which n-type dopant such as phosphorus (P), arsenicum (As), antimony (Sb), or the like is diffused in single-crystalline silicon, is optionally selected employed in accordance with application therefor.

A micro-irregular texture structure (not shown in the figure) is formed on a top face of the silicon substrate 1 by texture etching.

As the silicon substrate 1, a substrate on which a texture was preliminarily formed may be prepared; a texture may be formed on a substrate by dry-etching a substrate in the embodiment.

In a solar cell, if the silicon substrate 1 on which the texture is formed is used, it is possible to increase the power generation efficiency thereof.

As the silicon substrate 1, the above-described single-crystalline silicon substrate as well as a polycrystalline silicon substrate is preferably used depending on the intended use. Therefore, the substrate can be appropriately selected and used.

In the case where the silicon substrate 1 is a p-type silicon substrate, a thin thickness layer that is obtained due to an n-type dopant such as phosphorus (P), arsenicum (As), antimony (Sb), or the like being diffused in the vicinity of the top face of the silicon substrate 1 is the diffused layer 2.

In addition, the case where the silicon substrate 1 is an n-type silicon substrate, a thin thickness layer that is obtained due to a p-type dopant such as boron (B), gallium (Ga), aluminum Al, indium (In), or the like being diffused in the vicinity of the top face of the silicon substrate 1 is the diffused layer 2.

The silicon layer 3 is a thin thickness layer which is composed of any of polysilicon in which part of or all of crystalline structure thereof is made of polysilicon, or amorphous silicon.

Dopant whose conductivity type is the same as that of the diffused layer 2 is included in the silicon layer 3, that is, if the diffused layer 2 is an n-type, an n-type dopant such as phosphorus (P), arsenicum (As), antimony (Sb), or the like is included in the silicon layer 3.

In addition, if the diffused layer 2 is a p-type, a p-type dopant such as boron (B), gallium (Ga), aluminum (Al), indium (In), or the like is included in the silicon layer 3.

The diffused layer 2 is a region that is obtained by diffusing the dopant included in the silicon layer 3 into the top face of the silicon substrate 1 by heat-treating the silicon layer 3.

The dopant concentration of the diffused layer 2 is determined so as to generate a PN-junction which is necessary for a solar cell.

Since the dopant concentration of the diffused layer 2 is determined based on, for example, the amount of diffusion from the silicon layer, the dopant concentration is lower than the dopant concentration of the silicon layer in which the diffusion was completed in most cases.

Generally, the dopant concentration of the silicon layer 3 to be formed is set higher than the dopant concentration that is required for the diffused layer 2.

In the case where, multilayered films in which a film having a high refractive index and a film having a low refractive index are stacked in layers are employed as an anti-reflective film 4, for example, silicon nitride ($SiN_x$), titanium oxide ($TiO_2$), niobium oxide ($Nb_2O_5$), magnesium fluoride ($MgF_2$), magnesium oxide (MgO), silicon oxide ($SiO_2$), or the like, having a refractive index of 1.0 to 4.0, is preferably used as the materials constituting the multilayered films.

In other cases, silicon nitride ($SiN_x$) or titanium oxide ($TiO_2$) is preferably used as the films when a fire-through process is performed.

The BSF layer 5 is a thin thickness layer which is formed due to the chemical element constituting a bottom electrode or the like of the silicon substrate 1 being diffused in the silicon substrate by heat-treating.

The BSF layer 5 is formed by, for example, forming a bottom electrode including aluminum on the back face of a p-type silicon substrate, and by diffusing aluminum in the silicon substrate due to heat-treating.

The first bottom electrodes 6, the second bottom electrode 7, and the top electrodes 8 are metal electrodes which are obtained by baking a paste including an electroconductive metal such as silver or aluminum.

The second bottom electrode 7 is formed on the back face of the silicon substrate 1 so as to have a band-shaped pattern, and is provided so as to intersect a central portion of the back face.

The first bottom electrodes 6 are provided at both sides of the second bottom electrode 7, and are formed on the back face of the silicon substrate 1 so as to have a rectangular pattern.

The top electrodes 8 are formed on the top face of the silicon substrate 1.

The top electrodes 8 have a structure, which is formed along a longitudinal direction of the second bottom electrode 7, in which a plurality of electrode pieces (for example, fifty electrode pieces) formed in a band orientation is arrayed.

The top electrodes 8 are connected to the silicon layer 3 or the diffused layer 2 by a fire-through process.

A heat treatment step for forming the above-described diffused layer 2, a heat treatment step for forming the BSF layer 5, and a step for heat-treating the top electrodes 8 by a fire-through process can be individually performed.

On the other hand, if any two of the steps or all of the steps are performed at the same time, it is possible to shorten the manufacturing time, eliminate the number of steps, and reduce the number of apparatuses.

Next, a method for manufacturing a solar cell according to the embodiment will be described with reference to drawings.

Figure 2:
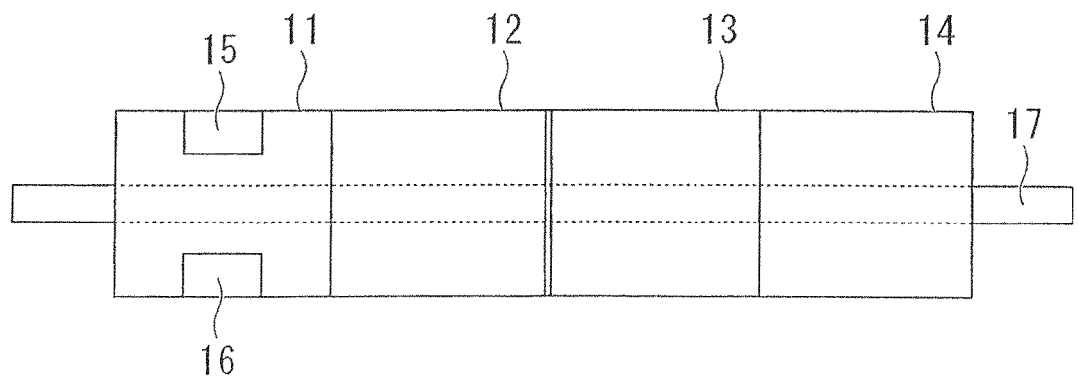
FIG. 2 is a schematic view an apparatus for manufacturing a solar cell of the first embodiment of the present invention.

FIG. 2 is a schematic view showing an apparatus for manufacturing a solar cell of the embodiment.

In FIG. 2, reference numeral 11 represents a first-film formation device forming a silicon layer on a substrate while introducing a gas including a dopant onto the substrate, reference numeral 12 represents a second-film formation device forming an anti-reflective film on the silicon layer, reference numeral 13 represents an electrode formation device forming an electrode on the substrate or on the anti-reflective film, and reference numeral 14 represents a heating device heating the substrate.

The first-film formation device 11 is provided with a heating section 15 heating the substrate and a plasma processing section 16 exposing the substrate to plasma.

A substrate transfer mechanism 17 transferring the substrate is provided at the first-film formation device 11, the second-film formation device 12, the electrode formation device 13, and the heating device 14, so that the substrate passes through the devices.

A vacuum state is maintained in the first-film formation device 11 and the second-film formation device 12. The first-film formation device 11 and the second-film formation device 12 are employed in a state where the inside thereof is set to a predetermined pressure.

An atmospheric pressure is maintained in the electrode formation device 13 and the heating device 14. The electrode formation device 13 and the heating device 14 are employed under atmospheric pressure.

Consequently, a load lock chamber (not shown in the figure) may be provided between the second-film formation device 12 and the electrode formation device 13.

In addition, the substrate is transferred between the first-film formation device 11 and the second-film formation device 12 in a state where a vacuum is maintained.

In addition, an etching device (not shown in the figure) that performs a texture-dry etching may be provided at upstream side of the first-film formation device 11 in a pathway in which the substrate is transferred.

In this case, the substrate is transferred in a state where a vacuum is maintained between the etching device, the first-film formation device 11, and the second-film formation device 12.

Subsequently, a method for manufacturing a solar cell of the embodiment by use of the manufacturing apparatus will be described with reference to FIGS. 3A to 3D.

Figure 3A:
FIGS. 3A to 3D are cross-sectional views showing a method for manufacturing a solar cell of the first embodiment of the present invention.

As shown in FIG. 3A, a top face of a silicon substrate 21 which is a p-type or an n-type is exposed to plasma and is thereby cleaned (plasma treatment).

As the silicon substrate 21 which is a p-type or an n-type, a single-crystalline silicon substrate or a polysilicon substrate is selected in accordance with application therefor.

In addition, a silicon substrate, which is a p-type or an n-type, in which a texture structure (not shown in the figure) is formed on the top face of the silicon substrate 21, is selected.

Specifically, the silicon substrate is placed in a plasma chemical vapor deposition apparatus forming the silicon layer, the inside pressure of the plasma chemical vapor deposition apparatus is reduced, thereafter, plasma is generated while introducing argon into the inside of the plasma chemical vapor deposition apparatus.

For this reason, the substrate is exposed to plasma, cleaning of the substrate is performed (plasma treatment).

The foregoing plasma treatment may be performed by use of a plasma generation apparatus for exclusive use.

In other cases, a step for dry-etching in a vacuum may be performed in order to form a texture structure on the top face of the substrate before the cleaning.

In addition, after performing the dry-etching, if a subsequent silicon layer is formed on the substrate while maintaining a vacuum atmosphere, it is possible to omit a complex step of removing the substrate from a vacuum atmosphere to an air atmosphere and cleaning the substrate.

Figure 3B:
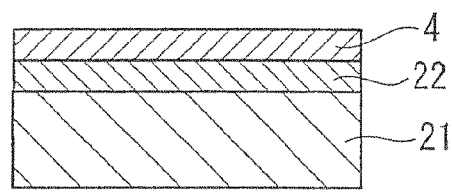

Next, as shown in FIG. 3B, a silicon layer 22 on the top face of the silicon substrate 21, the silicon layer 22 including the dopant whose conductivity type is different from that of the silicon substrate 21.

The silicon layer 22 is polysilicon, amorphous silicon, microcrystalline silicon, or a mixture composed thereof.

In the case where the silicon substrate 21 is, for example, a p-type silicon substrate, a silicon layer 22 in which an n-type dopant such as phosphorus (P), arsenicum (As), or antimony (Sb) is included is formed.

In addition, in the case where the silicon substrate 21 is an n-type silicon substrate, a silicon layer 22 in which a p-type dopant such as boron (B), gallium (Ga), or aluminum (Al) is included is formed.

Next, the anti-reflective film 4 composed of silicon nitride (SiNx), titanium oxide ($TiO_2$), niobium oxide ($Nb_2O_5$), magnesium fluoride ($MgF_2$), magnesium oxide (MgO), silicon oxide ($SiO_2$), or the like is formed on the silicon layer 22 by a chemical vapor deposition method, a magnetron sputtering method, a high-frequency (RF) magnetron sputtering method or the like.

The anti-reflective film 4 is formed while the silicon substrate 21 is heated.

Figure 3C:
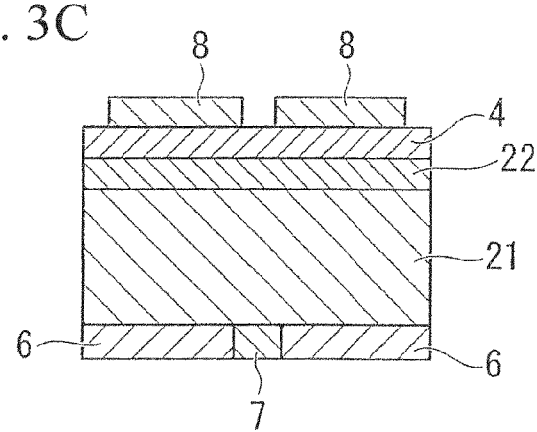

Next, as shown in FIG. 3C, the top electrodes 8 composed of silver and having a predetermined shape is formed on the anti-reflective film 4 by a screen printing method.

Next, the first bottom electrodes 6 and the second bottom electrode 7 having a predetermined shape are formed on the back face of the silicon substrate 21 by a screen printing method.

In the case of the silicon substrate 21 being a p-type, the material of the first bottom electrodes 6 is aluminum and the material of the second bottom electrode 7 is silver.

Figure 3D:
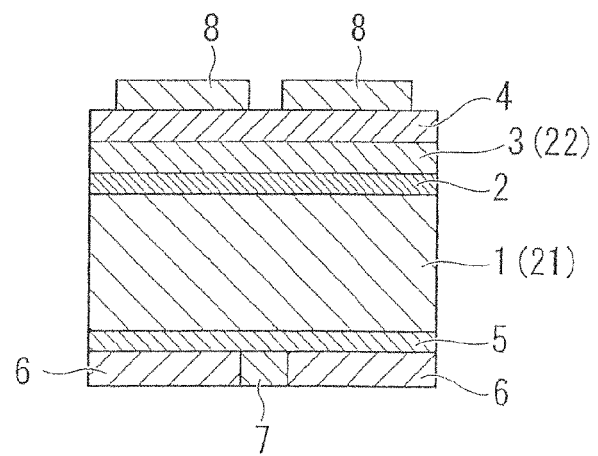

Next, as shown in FIG. 3D, the silicon substrate 21 in which the silicon layer 22, the anti-reflective film 4, the top electrodes 8, the first bottom electrodes 6, and the second bottom electrode 7 are formed is heat-treated.

In the heat treatment, as the condition therefor, the atmosphere therefor is a reducing atmosphere or an inert atmosphere, a temperature is greater than or equal to 600° C. and less than or equal to 1200° C., and the time therefor is greater than or equal to 1 minute and less than or equal to 120 minutes.

According to the heat treatment, the dopant included in the silicon layer 22 is diffused into the silicon substrate 21, and the diffused layer 2 is thereby formed.

Furthermore, in the case of the silicon substrate 21 being a p-type, aluminum included in the first bottom electrodes 6 is diffused into the silicon substrate 21 by the heat treatment, and the BSF layer 5 is thereby formed on the back face of the silicon substrate 21.

Moreover, the top electrodes 8 penetrate through the anti-reflective film 4 by the fire-through, and are connected to the silicon layer 22 or the silicon substrate 21.

In the above-described manner, it is possible to obtain the solar cell of the embodiment.

According to the solar cell of the embodiment, since the diffused layer 2 in which the n-type (or p-type) dopant is diffused is formed adjacently on the top face of the p-type (or n-type) silicon substrate 1, and the silicon layer 3 including the n-type (or p-type) dopant is stacked in layers on the diffused layer 2, it is possible to obtain the light conversion efficiency that is equal to that of a conventional solar cell.

In addition, it is possible to form the diffused layer 2 and the BSF layer 5 at the same time, furthermore, it is possible to form them in a short amount of time compared with a conventional method.

Because of this, it is possible to shorten the length of processing time for forming the diffused layer 2 and the BSF layer 5, as a result, it is possible to shorten the manufacturing time, eliminate the number of steps, and reduce the cost of manufacturing.

Furthermore, it is possible to treat the steps for forming the texture by a dry-etching, forming the silicon layer, forming the anti-reflective film, or the like in a series of vacuum devices.

Therefore, it is possible to shorten the evacuation time and maintain the substrate in a cleaned state, without repeating the operation of changing the inside atmosphere of the vacuum devices from a vacuum state to air atmosphere or from air atmosphere to a vacuum state.

Second Embodiment

Subsequently, a method for manufacturing a solar cell of a second embodiment of the present invention will be described with reference to FIGS. 4A to 4D.

In addition, in FIGS. 4A to 4D, symbols are used for the elements which are identical to those of FIGS. 3A to 3D, and the explanations thereof are omitted or simplified.

Figure 4A:
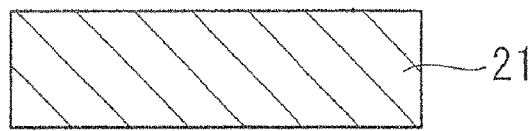
FIGS. 4A to 4D are cross-sectional views showing a method for manufacturing a solar cell of a second embodiment of the present invention.

As shown in FIG. 4A, a texture structure (not shown in the figure) is formed on the top face of the silicon substrate 21 whose conductivity type is a p-type or an n-type, and the top face thereof is cleaned.

Figure 4B:
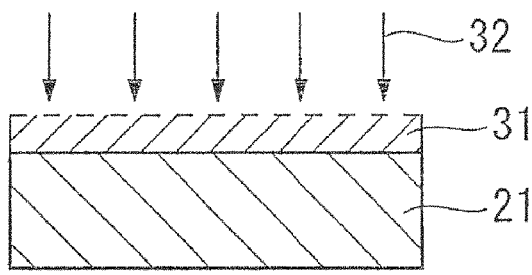

Next, as shown in FIG. 4B, a silicon layer 31 on the top face of the silicon substrate 21, the silicon layer 31 including a dopant whose conductivity type is different from that of the silicon substrate 21.

In the method for forming the silicon layer 31, the heat treatment is performed by heating the silicon layer 31 which is in a film formation process as indicated by reference numeral 32, by use of a heater or an infrared light irradiation device.

In the condition of heat treatment, the atmosphere therefor is an inert gas (for example, $N_2$) atmosphere of the atmospheric pressure a temperature is greater than or equal to 600° C. and less than or equal to 1200° C.

Figure 4C:
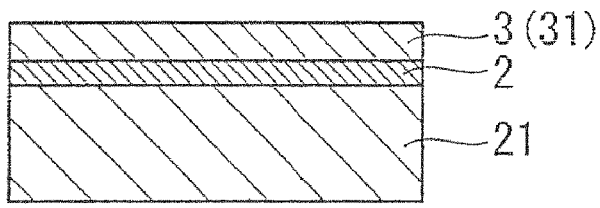

In this manner, as shown in FIG. 4C, the dopant included in the silicon layer 31 is diffused into the silicon substrate 21.

Consequently, the diffused layer 2 whose dopant concentration is lower than the dopant concentration of the silicon layer 31 is formed in the silicon substrate 21 and in the vicinity of the boundary face between the silicon substrate 21 and the silicon layer 31, and the silicon layer 31 becomes the silicon layer 3 in which the dopant concentration thereof decreases.

Figure 4D:
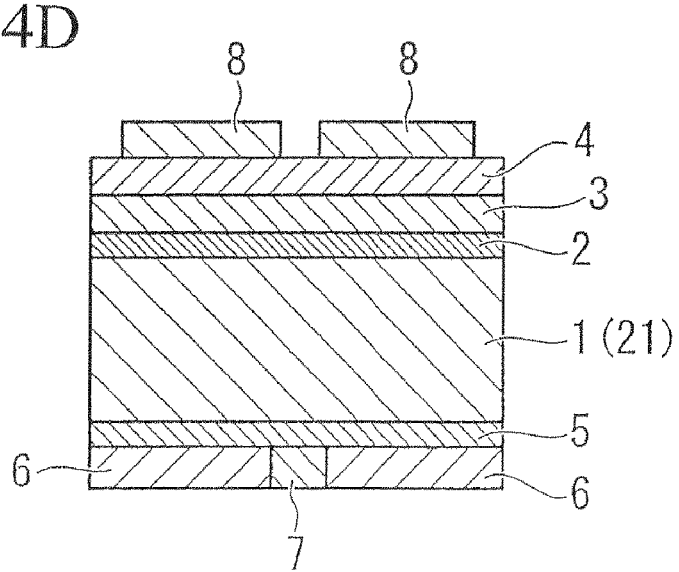

Next, as shown in FIG. 4D, the anti-reflective film 4 composed of silicon nitride (SiNx), titanium oxide ($TiO_2$), niobium oxide ($Nb_2O_5$), magnesium fluoride ($MgF_2$), magnesium oxide (MgO), silicon oxide ($SiO_2$), or the like is formed on the silicon layer 3 by a chemical vapor deposition method, a magnetron sputtering method, a high-frequency (RF) magnetron sputtering method or the like.

Next, the top electrodes 8 composed of silver and having a predetermined shape is formed on the anti-reflective film 4 by a screen printing method.

Next, the first bottom electrodes 6 and the second bottom electrode 7 having a predetermined shape are formed on the back face of the silicon substrate 21 by a screen printing method.

In the case of the silicon substrate 21 of a p-type being used, the material of the first bottom electrodes 6 is aluminum and the material of the second bottom electrode 7 is silver.

Next, the silicon substrate 21 in which the silicon layer 3, the anti-reflective film 4, the top electrodes 8, the first bottom electrodes 6, and the second bottom electrode 7 are formed is heat-treated.

In the case of a p-type silicon substrate being used, the BSF layer 5 is formed due to aluminum included in the first bottom electrodes 6 being diffused into the silicon substrate 21 by the heat treatment, and the portions except for the BSF layer 5 becomes the silicon substrate 1.

Furthermore, the top electrodes 8 penetrate through the anti-reflective film 4 by the fire-through, and are connected with the silicon substrate.

In the heat treatment, the temperature condition therefor is greater than or equal to 500° C. and less than or equal to 900° C.; and the length of processing time therefor is shorter than that of the heat treatment for forming the diffused layer 2 (for example, 1 minute or less).

In the above-described manner, it is possible to obtain the solar cell of the embodiment.

According to the embodiment, in a similar manner to the first embodiment, it is also possible to obtain a light conversion efficiency that is equal to that of a conventional solar cell.

In addition, it is possible to form the diffused layer 2 and the BSF layer 5 at the same time, furthermore, it is possible to form the diffused layer 2 by performing the heat-treatment to the silicon layer 32 at the same time when forming the silicon layer 32.

Therefore, it is possible to further shorten the length of time for a heat-treating to form the diffused layer 2, it is possible to further shorten the manufacturing time, eliminate the number of steps, and reduce the cost of manufacturing.

EXAMPLES

Hereinafter, based on examples and comparative examples, the present invention will be specifically described, the present invention is not limited to the examples.

Example 1

A silicon layer including phosphorus (P) was formed by a chemical vapor deposition method on a p-type single-crystalline silicon substrate in which a texture structure was formed on a top face thereof by texture etching, the silicon substrate having a thickness of 220 μm and 156-mm-square.

Regarding film formation conditions, a substrate temperature was 300° C., the flow rate of $SiH_4$ gas was 300 sccm, the flow rate of $PH_3$ gas which is diluted with 1 vol % of $H_2$ was 360 sccm, and the power therefor was 300 W.

The obtained silicon layer was a layer referred to as amorphous microcrystalline in which micro polysilicon is scattered in amorphous silicon, and the thickness thereof was 50 nm.

Next, an anti-reflective film composed of silicon nitride (SiNx) was formed on the silicon layer by a chemical vapor deposition method.

Regarding film formation conditions, a substrate temperature was 400° C., the flow rate of $SiH_4$ gas was 30 sccm, the flow rate of $NH_3$ gas was 30 sccm, the flow rate of $N_2$ gas that is a carrier gas was 600 sccm, and the power therefor was 300 W.

The thickness of the obtained anti-reflective film was 70 nm.

Next, a silver paste having a thickness of 20 μm was applied by a screen printing method on a band shaped region of a back face of the silicon substrate, on which a second bottom electrode 7 is to be formed; thereafter, the paste was dried at 150° C. for 10 minutes.

Next, an aluminum paste having a thickness of 20 μm was applied by a screen printing method on the entire region of the back face of the silicon substrate which excludes the second bottom electrode 7; thereafter, the paste was dried at 150° C. for 10 minutes.

Furthermore, a silver paste having a thickness of 20 μm was applied by a screen printing method on a region of the top face of the silicon substrate on which a top electrode is to be formed; thereafter, the paste was dried at 150° C. for 10 minutes.

As a result, first bottom electrodes 6, a second bottom electrode 7, and top electrodes 8 were formed.

Next, the silicon substrate was subjected to a heat-treatment at 750° C. for 1 minute.

In this way, a BSF layer having approximately 10 μm of depth was formed on the back face of the silicon substrate.

Simultaneously, the top electrode breaks through the anti-reflective film and was in contact with the diffused layer.

In addition, the dopant included in the silicon layer was diffused into the silicon substrate, and the diffused layer 2 was formed.

In the solar cell that was obtained in this manner, the light conversion efficiency that is equal to that of the solar cell in which the diffused layer is formed by a conventional method was obtained.

Example 2

A silicon layer including boron (B) was formed by a chemical vapor deposition method on an n-type single-crystalline silicon substrate in which a texture structure was formed on a top face thereof by texture etching, the silicon substrate having a thickness of 220 μm and 156-mm-square.

Regarding film formation conditions, a substrate temperature was 300° C., the flow rate of $SiH_4$ gas was 300 sccm, the flow rate of $B_2H_6$ gas which is diluted with 0.5 vol % of $H_2$ was 360 sccm, the power therefor was 300 W.

The obtained silicon layer was a layer referred to as amorphous microcrystalline in which micro polysilicon is scattered in amorphous silicon, and the thickness thereof was 50 nm.

Next, an anti-reflective film composed of silicon nitride (SiNx) was formed on the silicon layer by a chemical vapor deposition method.

Regarding film formation conditions, a substrate temperature was 400° C., the flow rate of $SiH_4$ gas was 30 sccm, the flow rate of $NH_3$ gas was 30 sccm, the flow rate of $N_2$ gas that is a carrier gas was 600 sccm, and the power therefor was 300 W.

The thickness of the obtained anti-reflective film was 70 nm.

Next, a silicon layer having a thickness of 0.5 μm in which phosphorus (P) is doped was formed on the back face of the silicon substrate by a DC magnetron sputtering method, and a silver paste having a thickness of 20 μm was applied by a screen printing method on a band shaped region of the back face on which a second bottom electrode 7 is to be formed; thereafter, the paste was dried at 150° C. for 10 minutes.

Furthermore, a silver paste having a thickness of 20 μm was applied by a screen printing method on a region of the top face of the silicon substrate on which a top electrode is to be formed; thereafter, the paste was dried at 150° C. for 10 minutes.

As a result, a second bottom electrode 7 and top electrodes 8 were formed.

Next, the silicon substrate was subjected to a heat-treatment at 750° C. for 1 minute.

In this way, a BSF layer having approximately 10 μm of depth was formed on the back face of the silicon substrate.

Simultaneously, the top electrode breaks through the anti-reflective film and was in contact with the diffused layer.

In addition, the dopant included in the silicon layer was diffused into the silicon substrate, and the diffused layer 2 was formed.

In the solar cell that was obtained in this manner, the light conversion efficiency that is equal to that of the solar cell in which the diffused layer is formed by a conventional method was obtained.

Comparative Example

A coating material including phosphorus (P) was applied on a top face a p-type single-crystalline silicon substrate in which a texture structure was formed on the top face thereof by texture etching, the silicon substrate having a thickness of 220 μm and 156-mm-square; subsequently, a heat treatment is performed at 900° C. for 10 minutes, and an n-type diffused layer having approximately thickness of 0.5 μm was formed in the vicinity of the top face of the silicon substrate.

Next, the diffused layer is rinsed by use of hydrofluoric acid and is further water-washed by use of an ultra deionized water; subsequently, an anti-reflective film composed of silicon nitride (SiNx) was formed on the diffused layer by a chemical vapor deposition method.

Regarding film formation conditions, a substrate temperature was 300° C., the flow rate of $SiH_4$ gas was 30 sccm, the flow rate of $NH_3$ gas was 30 sccm, the flow rate of $N_2$ gas that is a carrier gas was 600 sccm, and the power therefor was 300 W.

The thickness of the obtained anti-reflective film was 70 nm.

Next, a silver paste having a thickness of 70 μm was applied by a screen printing method on a band shaped region of a back face of the silicon substrate, on which the second bottom electrode 7 is to be formed; thereafter, the paste was dried at 150° C. for 10 minutes.

Next, an aluminum paste having a thickness of 70 μm was applied by a screen printing method on a rectangular region of the back face of the silicon substrate on which the first bottom electrodes 6 are to be formed; thereafter, the paste was dried at 150° C. for 2 minutes.

Furthermore, a silver paste having a thickness of 20 μm was applied by a screen printing method on a region of the top face of the silicon substrate on which a top electrode is to be formed; thereafter, the paste was dried at 150° C. for 10 minutes.

As a result, the first bottom electrodes 6, the second bottom electrode 7, and the top electrode were formed.

Next, the silicon substrate was subjected to a heat-treatment at 750° C. for 3 seconds.

In this way, a BSF layer having approximately 10 μm of depth was formed on the back face of the silicon substrate.

Simultaneously, the top electrode breaks through the anti-reflective film composed of silicon nitride (SiNx) and was in contact with the diffused layer.

The photoelectric conversion efficiency of the solar cell that is obtained in this manner was 12 to 17%.

However, in the case where the rinsing is insufficient or the substrate is not maintained in a cleaned state after the rinsing, the photoelectric conversion efficiency is often degraded and irregularities in quality often occur.

According to the above-described results, it was found that both of the output and the photoelectric conversion efficiency of examples 1 and 2 are further improved or are the same as that of comparative example.

In addition, in examples 1 and 2, it is possible to form the diffused layer, the BSF layer, and two of the bottom electrode and the top electrode at the same time by heat-treating once; the length of time required for the manufacturing process was considerably shortened compared with conventional manufacturing methods.

INDUSTRIAL APPLICABILITY

As described above, the present invention is applicable to a method for manufacturing a solar cell, an apparatus for manufacturing a solar cell, and a solar cell where it is possible to shorten the length of time for a heat-treating when a diffused layer is formed in a silicon substrate, furthermore, to shorten the manufacturing time and to eliminate the number of steps by performing the diffusing of the dopant and the fire-through of the top electrode at the same time, in addition, it is possible to manufacture a solar cell having the photoelectric conversion efficiency that is equal to that of a conventional solar cell.

What is claimed is:

1. A method for manufacturing a solar cell, comprising:
   forming, on a silicon substrate whose conductivity type is p-type or n-type, a silicon layer including a dopant whose conductivity type is different from that of the silicon substrate, the silicon layer contacting the silicon substrate, and the silicon layer being formed by a chemical vapor deposition method;
   diffusing the dopant included in the silicon layer into the silicon substrate by heat-treating the silicon layer, wherein the dopant is diffused at a temperature higher than or equal to 600° C. and less than or equal to 1200° C.;
   generating a PN-junction within the silicon substrate;
   forming an anti-reflective film on the silicon layer after the silicon layer is formed; and
   forming a top electrode on the anti-reflective film, wherein when the dopant included in the silicon layer is diffused in the silicon substrate, the top electrode is electrically-conducted to the silicon layer or the silicon substrate and the dopant is diffused in the silicon substrate by heating the silicon substrate in which the silicon layer, the anti-reflective film, and the top electrode were formed.

2. The method for manufacturing a solar cell according to claim 1, further comprising:
   forming the anti-reflective film on the silicon layer in a state where the silicon substrate is maintained under a vacuum atmosphere, after the silicon layer is formed.

3. The method for manufacturing a solar cell according to claim 1, wherein when the dopant included in the silicon layer is diffused in the silicon substrate, maximum level of heating temperature is greater than or equal to 600° C. and less than or equal to 1200° C., and heating time is greater than or equal to 1 minute and less than or equal to 120 minutes.

4. The method for manufacturing a solar cell according to claim 1, further comprising:
   exposing the silicon substrate to plasma in a vacuum before forming the silicon layer, and
   subsequently forming the silicon layer in a state where the silicon substrate is maintained under a vacuum atmosphere after the silicon substrate was exposed to plasma.

5. The method for manufacturing a solar cell according to claim 4, wherein the silicon layer is formed by a plasma chemical vapor deposition method, the silicon substrate is exposed to plasma and the silicon layer is formed by use of the same plasma chemical vapor deposition apparatus.

6. The method for manufacturing a solar cell according to claim 4, further comprising:
   forming a texture by dry-etching a top face of the silicon substrate in a vacuum before forming the silicon layer; and
   subsequently exposing the silicon substrate to plasma in a state where the silicon substrate is maintained under a vacuum atmosphere after the dry-etching.

7. The method for manufacturing a solar cell according to claim 1, further comprising:
   forming a texture by dry-etching a top face of the silicon substrate in a vacuum before forming the silicon layer; and
   subsequently forming the silicon layer in a state where the silicon substrate is maintained under a vacuum atmosphere after the etching.

8. A method for manufacturing a solar cell, comprising:
   forming, on a silicon substrate whose conductivity type is p-type or n-type, a silicon layer including a dopant whose conductivity type is different from that of the silicon substrate, the silicon layer contacting the silicon substrate, and the silicon layer being formed by a chemical vapor deposition method;
   diffusing the dopant included in the silicon layer into the silicon substrate by heating the silicon substrate during the forming of the silicon layer, wherein the dopant is diffused at a temperature greater than or equal to 600° C. and less than or equal to 1200° C.; and
   generating a PN-junction within the silicon substrate.

9. The method for manufacturing a solar cell according to claim 8, wherein when the dopant included in the silicon layer is diffused in the silicon substrate by heating the silicon substrate during the forming of the silicon layer, maximum level of heating temperature is greater than or equal to 600° C. and less than or equal to 1200° C., and heating time is greater than or equal to 1 minute and less than or equal to 120 minutes.

10. The method for manufacturing a solar cell according claim 8, further comprising:
    exposing the silicon substrate to plasma in a vacuum before diffusing the dopant included in the silicon layer into the silicon substrate by heating the silicon substrate during the forming of the silicon layer; and
    subsequently diffusing the dopant included in the silicon layer into the silicon substrate by heating the silicon substrate during the forming of the silicon layer in a state where the silicon substrate is maintained under a vacuum atmosphere after the silicon substrate was exposed to plasma.

11. The method for manufacturing a solar cell according to claim 10, wherein the silicon layer is formed by a plasma chemical vapor deposition method, the silicon substrate is exposed to plasma and the dopant included in the silicon layer is diffused into the silicon substrate by heating the silicon substrate during the forming of the silicon layer by use of the same plasma chemical vapor deposition apparatus.

12. The method for manufacturing a solar cell according to claim 10, further comprising:
    forming a texture by dry-etching a top face of the silicon substrate in a vacuum before diffusing the dopant included in the silicon layer into the silicon substrate by heating the silicon substrate during the forming of the silicon layer; and
    subsequently exposing the silicon substrate to plasma in a state where the silicon substrate is maintained under a vacuum atmosphere after the dry-etching.

13. The method for manufacturing a solar cell according to claim 8, further comprising:
    forming a texture by dry-etching a top face of the silicon substrate in a vacuum before diffusing the dopant included in the silicon layer into the silicon substrate by heating the silicon substrate during the forming of the silicon layer; and
    subsequently diffusing the dopant included in the silicon layer into the silicon substrate by heating the silicon substrate during the forming of the silicon layer in a state where the silicon substrate is maintained under a vacuum atmosphere after the dry-etching.

14. A method for manufacturing a solar cell comprising:
    forming, on a silicon substrate whose conductivity type is p-type or n-type, a silicon layer including a dopant whose conductivity type is different from that of the silicon substrate, the silicon layer contacting the silicon substrate, and the silicon layer being formed by a chemical vapor deposition method;
    diffusing the dopant included in the silicon layer into the silicon substrate by heat-treating the silicon layer, wherein the dopant is diffused at a temperature higher than or equal to 600° C. and lower than or equal to 1200° C.; and generating a PN-junction within the silicon substrate;
    wherein
when the silicon layer is formed, a silicon layer including an n-type dopant is formed on a top face of a p-type silicon substrate;
after the silicon layer is formed, a bottom electrode including aluminum is formed on a back face of the silicon substrate; and
when the dopant included in the silicon layer is diffused in the silicon substrate, and a part of the aluminum of the bottom electrode is diffused in the silicon substrate by heating the silicon substrate in which the silicon layer and the bottom electrode were formed.

* * * * *